(12) United States Patent
Ohtsuki

(10) Patent No.: US 7,061,234 B2
(45) Date of Patent: Jun. 13, 2006

(54) MODULAR PROXIMITY SENSOR

(75) Inventor: Hidetomo Ohtsuki, Kyoto (JP)

(73) Assignee: Omron Corporation, Kyoto (JP)

(*) Notice: Subject to any disclaimer, the term of this patent is extended or adjusted under 35 U.S.C. 154(b) by 9 days.

(21) Appl. No.: 10/383,887

(22) Filed: Mar. 10, 2003

(65) Prior Publication Data

US 2004/0021460 A1 Feb. 5, 2004

(30) Foreign Application Priority Data

Mar. 12, 2002 (JP) .............................. 2002-066867

(51) Int. Cl.
*G01B 7/14* (2006.01)

(52) U.S. Cl. .................................. 324/207.26

(58) Field of Classification Search .......... 324/207.26, 324/228, 239, 233, 329, 207.24, 207.15, 324/207.16, 207.17, 326, 327, 234, 236; 439/284; D10/46, 47, 75

See application file for complete search history.

(56) References Cited

U.S. PATENT DOCUMENTS

| | | | | |
|---|---|---|---|---|
| 3,896,371 A | * | 7/1975 | Hametta | 324/327 |
| 4,030,026 A | * | 6/1977 | Payne | 324/329 |
| 4,130,792 A | * | 12/1978 | Sullivan | 324/327 |
| 4,470,015 A | * | 9/1984 | Hirschi et al. | 324/329 |
| 5,259,780 A | * | 11/1993 | Morrissey et al. | 439/292 |
| 6,482,045 B1 | * | 11/2002 | Arai | 439/680 |

* cited by examiner

*Primary Examiner*—Bot Ledynh
*Assistant Examiner*—Kenneth J. Whittington
(74) *Attorney, Agent, or Firm*—Foley & Lardner LLP

(57) ABSTRACT

A preamplifier portion 2 is arranged between a head portion 1 containing a detecting coil and an amplifier portion 3, wherein a detecting circuit and a controlling circuit and the like are arranged. The preamplifier portion 2 is connected to the head portion 1 via a shielded cable 5 of fixed length, while connected to the amplifier portion 3 via multi core cables 6a and 6b having connectors 7a and 7b. In the preamplifier portion 2, in addition to an oscillating circuit, an EEPROM containing a compensating table for compensating the relation between the oscillation output of the oscillating circuit and a detected distance is arranged. This EEPROM is connected to the controlling circuit at the side of the amplifier portion 3.

19 Claims, 5 Drawing Sheets

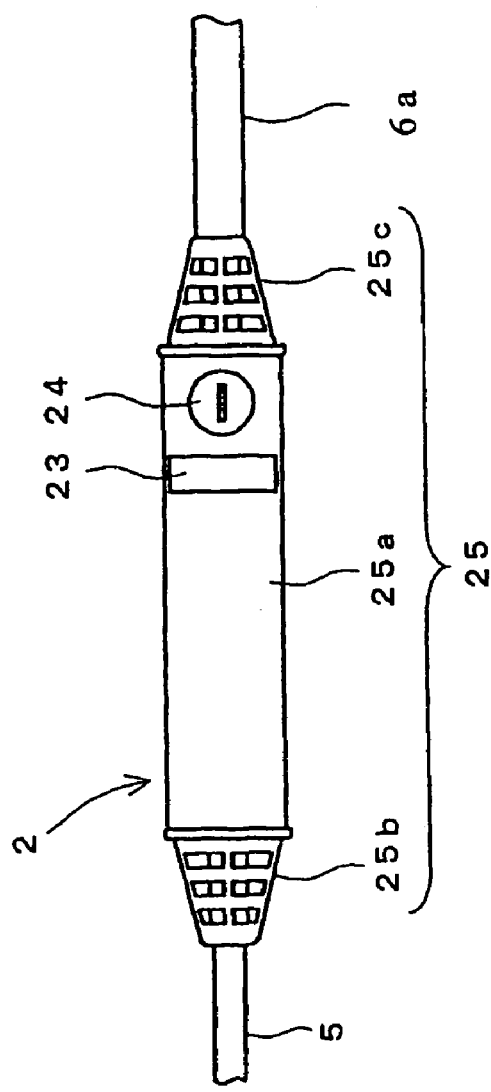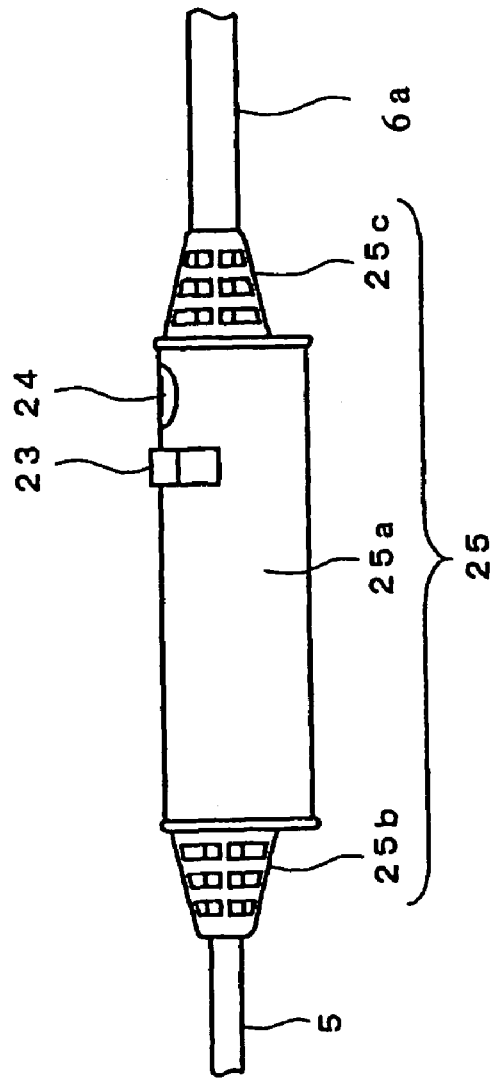
Fig. 2(A)
Fig. 2(B)

MODULAR PROXIMITY SENSOR

BACKGROUND OF THE INVENTION

1. Field of the Invention

The present invention relates to a proximity sensor to be used for applications to detect an approaching metallic material and output an ON signal, to detect the distance from such a metallic material, and so forth. More specifically, the invention relates to an amplifier separate type proximity sensor wherein a circuit for outputting a signal representing a detection result is contained in a case different from one for the detecting coil.

2. Description of the Background Art

Generally, a proximity sensor comprises a high frequency oscillating circuit equipped with an LC resonance circuit, a detecting circuit for detecting oscillation amplitude of this oscillating circuit, a controlling circuit for generating a signal representing a detection result by use of the output from the detecting circuit, an output circuit for outputting a signal representing the detection result, and the like. Especially, a sensor of a type that outputs a signal representing a distance to a metallic material as the detection result, wherein functions of the controlling circuit and the output circuit increase in number and the circuit scale thereof becomes large, is structured in many cases as an amplifier separate type sensor in which at least circuits after the detecting circuit are arranged in a case different from one for a detecting coil.

FIG. 4 shows an example of an amplifier separate type proximity sensor according to the prior art. The proximity sensor shown therein includes a detecting coil 201, an initial stage circuit portion 202 including an oscillating circuit and the similar in its head portion 101A, while circuits of the detecting circuit, controlling circuit, output circuit and the like (collectively shown as a main circuit portion 203 in the figure) in its amplifier portion 102A, and the head portion 101A and the amplifier portion 102A are connected with a cable.

In the structure mentioned above, a capacitor that as well as the detecting coil 201 configures a resonance circuit is included in the oscillating circuit of the initial stage circuit portion 202. Invariables of the capacitor and resistance and the similar are adjusted according to the invariable of the detecting coil so that the oscillating circuit carries out oscillation at a specific frequency.

And the initial stage circuit portion 202 further includes a memory to which parameters and the like are memorized in order to compensate the distance to a detection object and oscillation amplitude so that their relation should be a proportional relation. The main circuit portion 203 compensates the oscillation amplitude of the oscillating circuit on the basis of information in this memory and outputs the oscillation amplitude, and also outputs a digital signal representing presence or absence of an object through comparison of this output value with a specific threshold value.

FIG. 5 shows another structure of an amplifier separate type proximity sensor. In this proximity sensor, its head portion 101B wherein only a detecting coil 201 is arranged, and its amplifier portion 102B wherein an initial stage circuit portion 202 and a main circuit portion 203 are arranged are connected with a cable. The initial stage circuit portion 202 in this case is also equipped with an oscillating circuit and a memory to which invariables are set according to each kind of the detecting coil 201, accordingly, the main circuit portion 203 may output a voltage signal proportional to the distance to a detection object, on the basis of information in the memory.

In the proximity sensor of the structure shown in FIG. 4, wherein the detecting coil 201 and the initial stage circuit portion 202 set according to the characteristics thereof are contained in the head portion 101A, it is possible to make identical the type of the amplifier portion 102A irrespective of the kind of the detecting coil 201. As a consequence, control at manufacturers' places may become easy, and users may reduce costs.

However, in the case when the initial stage circuit portion 202 is included also in the head portion 101A, the size of the head portion 101A become large, in some cases, it is impossible to install the head portion 101A in a place that users desire (for example, in a robot hand portion). And further, such an electronic part as a memory is arranged at the head portion 101A, accordingly, it is difficult to install the head portion 101A under high temperature environments, and this lead to low environmental resistance, which has been a problem in the prior art.

On the other hand, according to the structure shown in FIG. 5, only the detecting coil 201 has to be contained in the head portion 101B, consequently, it is possible to make the head portion 101B compact and to install it in easy manners. However, the detecting coil 201 at the head portion 101B and the initial stage circuit portion 202 at the amplifier portion 102B have to be corresponded according to kinds and characteristics of the detecting coil 201, therefore, it is necessary to prepare the amplifier portion 102B for each type of the head portion 101B. For this reason, if the head portion 101B gets faulty and must be exchanged with one of a different type, then the amplifier portion 102B must also be exchanged, which leads to increased costs at users. And at manufacturers' side, the head portion 101B and the amplifier portion 102B must also be controlled on one to one basis, which increases burdens and deteriorates manufacturing efficiency too, which has been another problem in the prior art.

While, as shown in FIG. 5, in the case where a cable is arranged between the detecting coil 201 and the initial stage circuit portion 202, the electrostatic capacity that this cable has will function as part of the capacitor of the resonance circuit. Therefore, if the length of the cable is changed, the oscillation frequency fluctuates accordingly, so it is preferable to fix the cable length between the head portion 101B and the amplifier portion 102B. And in order to minimize the temperature curve and the noise influence between the head portion 101B and the amplifier portion 102B, it is preferable to make the cable as short as possible. Nevertheless, environment where this kind of a sensor is installed varies greatly, therefore, if the cable length is fixed short, it becomes difficult to install the amplifier portion 102B in some environmental conditions, which has been a still further problem in the prior art.

SUMMARY OF THE INVENTION

The present invention has been made in consideration of the problems in the prior art, accordingly, it is a primary object of the present invention to provide a proximity sensor wherein a head portion may be made compact and highly environment resistant, and an amplifier portion of an identical type may be used even when the kind of a detecting coil is changed.

It is another object of the present invention to provide a proximity sensor that will not affect the actions of the oscillating circuit, and enables installation of the amplifier portion at places according to various installation conditions.

A proximity switch according to the present invention may be embodied as one wherein a preamplifier portion is arranged between a head portion containing a detecting coil and an amplifier portion for outputting a signal representing a detection result, and the preamplifier portion is connected to the head portion and the amplifier portion respectively via a cable, and an oscillating circuit for supplying high frequency current to the detecting coil is arranged in the preamplifier portion.

In the structure mentioned above, the oscillating circuit of the preamplifier portion may include a capacitor to configure the detecting coil and the resonance circuit. This capacitor may be arranged together with the detecting coil at the side of the head portion, while in order to make the head portion compact, it is preferred to arrange it at the side of the preamplifier portion. On the other hand, it is preferable to arrange to the amplifier portion the abovementioned main circuit portion, namely, circuits whose circuit invariables are not necessary to be set even when the kind of the detecting coil is changed.

Another proximity sensor according to the present invention may be embodied as one comprising a head portion containing a detecting coil, a preamplifier portion having an oscillating circuit, an amplifier portion having a processing circuit, a first cable for connecting the head portion and the preamplifier portion, and a second cable for connecting the preamplifier portion and the amplifier portion, wherein the oscillating circuit of the preamplifier portion is connected to the detecting coil of the head portion via a first cable, and oscillates the detecting coil as a resonance circuit element to affect upon oscillation continuation and suspension, oscillation amplitude, or oscillation frequency, the preamplifier portion outputs oscillation output of the oscillating circuit, or output of detected oscillation output via the second cable to the amplifier portion, and the processing circuit of the amplifier portion detects whether presence or absence of an object or the distance from an object, on the basis of the output taken via the second cable from the preamplifier.

In the structure mentioned above, the oscillation output of the preamplifier portion or the output of detected oscillation output may be output through conversion into digital signals.

According to the proximity sensors of the respective structures explained above, it is possible, at the amplifier portion, to take the output from the preamplifier portion, and to detect presence or absence of a metallic material according to the changes of the oscillation amplitude or oscillation frequency thereof.

And in the proximity sensors of the respective structures explained above, since the oscillating circuit whose settings are required to be changed according to the kind of a detecting coil may be contained in the preamplifier portion arranged between the head portion and the amplifier portion respectively, it is possible to respond to any kind of detecting coil by the amplifier portion of an identical type. And because only the detecting coil may be contained in the head portion, it is possible to make the head portion compact and highly environment resistant, and to flexibly respond to various installation conditions of the head portion.

By the way, the size of the preamplifier portion only has to be enough to contain the oscillating circuit or the oscillating circuit and a memory in addition thereto, therefore, the preamplifier portion will not become large. For example, a long case body expanding in the lengthwise direction of a connection cable may be used as the main body of the preamplifier portion, then there is no need to prepare a wide place for installing the preamplifier portion, and it is possible to easily respond to the installation environment similar to those for the connection cable.

Further, the present invention is to provide, a proximity sensor wherein a memory storing information corresponding to the combination of the detecting coil and the oscillating circuit are arranged in the preamplifier portion.

Further, according to a proximity sensor having a memory in its preamplifier portion, it is possible to make the amplifier portion carry out detecting processing according to characteristics of detecting coil and oscillating circuit, on the basis of information in the memory.

In the preferred structure having a memory in the preamplifier portion, a processing circuit for converting the oscillation output of the oscillating circuit after detection into a signal representing a distance is arranged in the amplifier portion. And parameters necessary for carrying out the converting processing are stored into the memory arranged in the preamplifier portion.

As parameters to be stored into the memory, compensating parameters for making the relation between distance and oscillation amplitude as a detection result into a proportional relation may be set. In this case, it is possible to set a compensating table wherein compensating parameters are allotted per oscillation amplitude, further it is possible to set plural compensating tables according to kinds of metals as detection object. And in the case when a nonmagnetic metallic material is to be a detection object, it is possible to set a compensating table wherein compensating parameters are allotted to oscillation frequency, in the place of oscillation amplitude.

The amplifier portion may include a detecting circuit and a processing circuit mentioned above. By the way, it is preferable to configure a processing circuit with a micro processor as its main component, but not limited to this, and a processing circuit may be structured by use of, for example, an ASIC (application specified IC).

According to the embodiment, it is possible for the processing circuit of amplifier portion for output a signal proportional to a detected distance, on the basis of oscillation output detected from the oscillation circuit after detection and parameters in memory, as a consequence, it is possible to provide a proximity sensor suitable for various control input means.

Further another proximity sensor according to the present invention may be embodied as one wherein information representing a standard oscillation output of the oscillating circuit is written into the memory, and the processing circuit includes error detecting means for collating the oscillation output of the oscillating circuit and the standard oscillation output in the memory and thereby detecting an action error of the oscillating circuit. By the way, the standard oscillation output of the oscillating circuit is oscillation amplitude or oscillation frequency at the status where there is not any metallic material as a detection object (when the distance is ∞), and it is preferred to be written at manufacturers' places in advance.

According to this preferred embodiment, even in the case when a detecting coil is aged and deteriorated accordingly leading to an action failure of the oscillating circuit, such a failure may be detected at once.

By the way, in the proximity sensor of the embodiment, in order to inform a user of an error detected by the error detecting means, warning means such as a lamp or a display unit may be arranged at the amplifier portion or the preamplifier portion. If this means is embodied, a user may confirm at necessity actions in a status where there is not any metallic material as a detection object, and also may judge the period to exchange the head portion or the preamplifier portion in easy manners.

A still another proximity sensor according to the present invention may be embodied as one wherein the memory is a readable and writable nonvolatile memory, and the processing circuit is set so as to be able to write specific information into the memory.

The contents of information that the processing circuit writes into the memory and the timing thereof may be freely set according to applications. For example, when to set various conditions concerning detecting processing including a threshold value and the like necessary for outputting a signal representing "an object present" according to the distance as the detection result, if backup data of this setting condition is written into the memory, in the case where the amplifier portion is exchanged owing to an failure or the like, it is possible to carry out settings to a new amplifier portion on the basis of the backup data of the memory.

And when an error of oscillation output is detected, the contents of the error concerned may be judged in detail and may be written into the memory. If this is embodied, in the case of failure with the head portion or the preamplifier portion, it is possible to recognize the contents of the failure concerned easily from the information on the memory, which helps to increase convenience.

And yet another proximity sensor according to the present invention may be embodied as one wherein a connector for connecting the second cable to the amplifier portion is arranged at the preamplifier portion. And still further another proximity sensor according to the present invention may be embodied as one wherein the second cable comprises connection cables attached to the preamplifier portion and the amplifier portion respectively, and a connectable connector arranged at the end of each of the connection cables.

In the 2 embodiments, the length of a connecting cable from the side of the amplifier portion to be connected to the connector or the connecting cable at the side of the preamplifier portion may be changed freely. And according to the second embodiment, a relay cable may be added between the connecting cable at the side of the preamplifier portion and the connecting cable at the side of the amplifier portion. Accordingly, it is possible to fix the cable length between the head portion and the preamplifier portion and thereby to maintain precision of detection output, while to adjust the cable length between the preamplifier portion and the amplifier portion thereby to install the amplifier portion to a desired place. And because the cable length between the amplifier portion and the preamplifier portion may be shortened, it is possible to reduce the noise influence to oscillation actions and temperature curve between the amplifier portion and the preamplifier portion, and to carry out stable detection actions.

By the way, the signal line included in the connecting cable between the head portion and the preamplifier portion may be connected directly to the detecting coil or the oscillating circuit, without a connecting connector or the like. In such a structure, removal from the connecting cable of the head portion and the preamplifier portion becomes difficult, therefore, both the head portion and the preamplifier portion may be provided as an integral member, which helps to make control simple and easy. And also it is possible to prevent connection mistake between the head portion and the preamplifier portion.

On the other hand, if the connecting cable is set to be detachable between the head portion and the preamplifier portion, in the case of a failure or the like, only the faulty portion concerned may be removed, and repaired or exchanged.

BRIEF DESCRIPTION OF THE DRAWINGS

FIG. 2(A) is a top view of the preamplifier portion 2, while FIG. 2(B) is a front view thereof.

DESCRIPTION OF THE PREFERRED EMBODIMENTS

Figure 1:
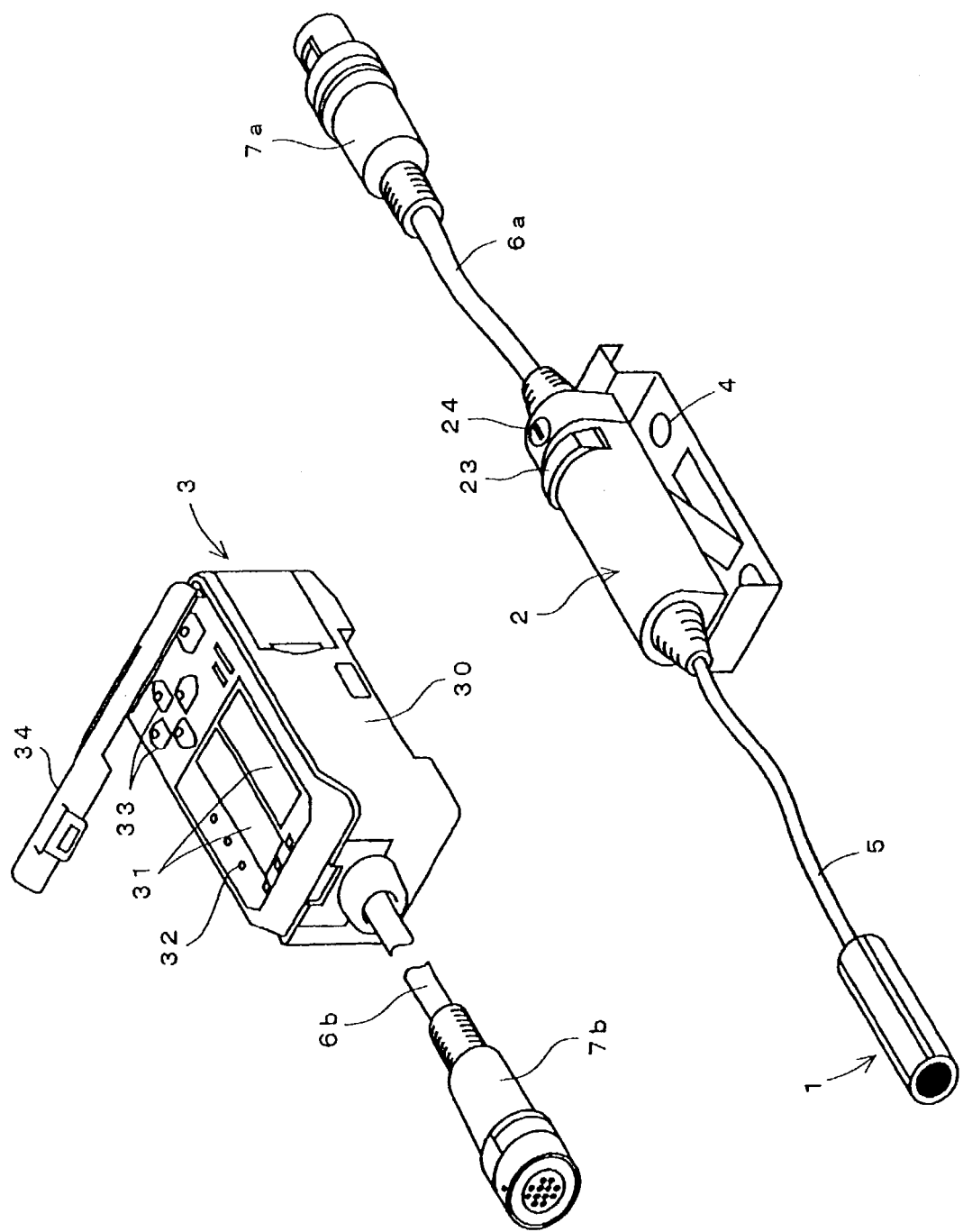
FIG. 1 is a perspective view showing an external appearance of a proximity sensor according to a preferred embodiment under the present invention.

FIG. 1 shows an external appearance of a proximity sensor according to a preferred embodiment under the present invention. The proximity sensor of this preferred embodiment is structured by arranging a preamplifier portion 2 between a head portion 1 and an amplifier portion 3. The above head portion 1 contains a detecting coil L (shown in FIG. 3), while the preamplifier portion 2 contains an oscillating circuit 21 for oscillating a high frequency (shown in FIG. 3) and the like. By the way, the code 4 in the figure is a supporting member for supporting the preamplifier portion 2, while this supporting component 4 is to be used at necessity, and has no influence upon the installation or actions of the preamplifier portion 2.

The head portion 1 and the preamplifier portion 2 are connected with a shielded cable 5. This shielded cable 5 includes a signal line for flowing high frequency current, and the detecting coil L is arranged to this signal line integrally.

Multi core cables 6a and 6b are attached to the preamplifier portion 2 and the amplifier portion 3 respectively. These multi core cables 6a and 6b include plural signal lines including a power supply line. By the way, the multi core cables 6a and 6b are inserted respectively into the main bodies of the preamplifier portion 2 and the amplifier portion 3, and each signal line is soldered onto a wiring substrate in the inside thereof.

And relay connectors 7a and 7b are arranged to the respective ends of the multi core cables 6a and 6b. The connector 7a at the side of the preamplifier portion 2 is a male type, while the connector 7b at the side of the amplifier portion 3 is a female type, and when these connectors 7a and 7b are connected with each other, the preamplifier portion 2 and the amplifier portion 3 get connected with each other via the respective signal lines.

By the way, the length of the multi core cable 6b at the side of amplifier portion 3 in this preferred embodiment may be arbitrarily set according to the installation conditions of the amplifier portion 3. And by inserting a relay cable (not illustrated herein) inbetween the multi core cables 6a and 6b, the distance between the preamplifier portion 2 and the amplifier portion 3 may be adjusted.

The amplifier portion 3 of this preferred embodiment converts the oscillation amplitude of the oscillating circuit 21 into a voltage signal representing a distance and outputs this voltage signal. (Hereinafter, this distance is referred to as "detected distance".) Further, this amplifier portion 3 has a function to digitally display the detected distance, and a function to compare the detected distance with a specific threshold value and thereby to output a detection signal representing presence or absence of a detection object (hereinafter referred to as "object presence/absence signal"). In the inside of a case body 30 that configures the main body of the amplifier portion 3, a circuit is assembled for the detecting processing and signal output. And on the upper surface of this case body 30, display units 31 for digitally displaying the detected distance, indication lamps 32 for showing the ON status of object presence/absence signal, operating switches 33 for inputting various setting data and so forth are arranged. By the way, the code 34 in the figure is a cover for protecting the upper surface.

FIG. 2(A) shows a top view of the preamplifier portion 2, while FIG. 2(B) shows a front view thereof. The preamplifier portion 2 of this preferred embodiment contains a wiring substrate (not illustrated herein) of the oscillating circuit 21 in a case body 25 made of resin and the like. In the case body 25, the cable insertion portions 25b and 25c are respectively arranged at both the ends of a cylindrical case body 25a so as to be integral. A shielded cable 5 and a multi core cable 6 are inserted into the case body 25 respectively via the cable insertion portions 25b and 25c, and the signal lines in these cables are soldered onto the wiring substrate.

On the upper surface of the case body 25, an indication lamp 23 and a volume switch 24 for setting (hereinafter referred to as "setting switch 24") are arranged. The indication lamp 23 and the setting switch 24 are connected to a CPU 36 (shown in FIG. 3) at the side of the amplifier portion 3 as to be described later herein. The indication lamp 23 is for confirming detection conditions, and is lit when the object presence/absence signal of the amplifier portion 3 is in its ON status. The setting switch 24 is for setting the threshold value to control the ON/OFF status of the object presence/absence signal.

According to the structure explained above, the preamplifier portion 2 is integrated with the shielded cable 5 and the multi core cable 6, and the longitudinal direction of the case body 25 is formed so as to expand in the longitudinal direction of these cables 5 and 6, therefore, there is no need to secure a wide installation place, and it is possible to install the preamplifier portion together with the respective cables 5 and 6 in free manners according to the environment of the installation place of the sensor.

And in the proximity sensor, while the cable length between the head portion 1 and the preamplifier portion 2 is fixed, the cable length between the preamplifier portion 2 and the amplifier portion 3 may be freely set according to the installation place of the amplifier portion 3, as a result, installation conditions may be flexibly handled without affecting upon actions of the oscillating circuit 21.

By the way, in this preferred embodiment, the detecting coil L in the head portion 1 and the signal line in the shielded cable 5 integrated, and the signal line is soldered onto the wiring substrate in the preamplifier portion 2, thereby the shielded cable 5 is prevented from being removed easily. However, in the place of this arrangement, a connecting connector may be attached to each of the head portion 1 and the preamplifier portion 2, thereby the shielded cable 5 may be connected so as to be detachable. And also with regard to the multi core cable, in the place of the method to fix multi core cables of a specific length 6a and 6b to the preamplifier portion 2 and the amplifier portion 3, connecting connectors for the multi core cables 6a and 6b may be arranged respectively, and a multi core cable of an arbitrary length may be connected to these connectors.

Figure 6:
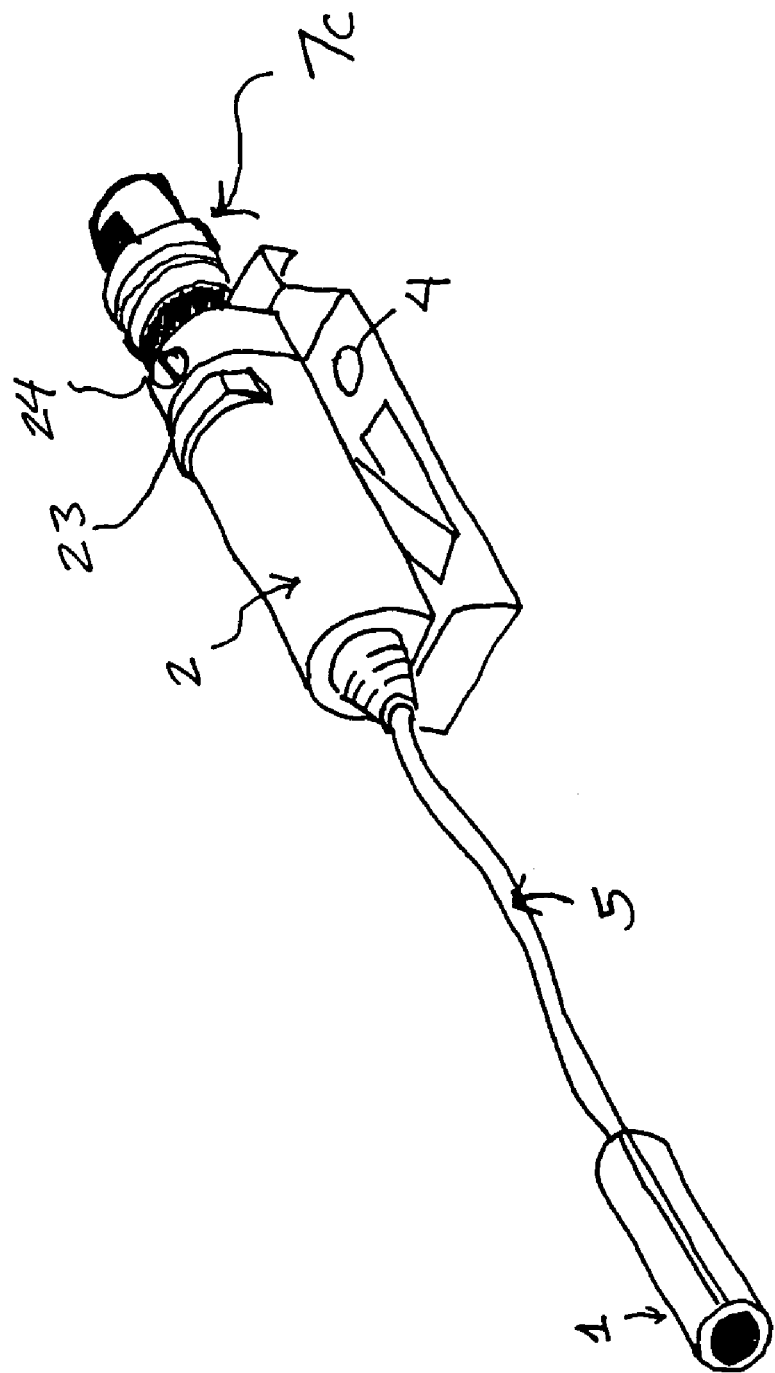
FIG. 6 is a perspective view showing an external appearance of a proximity sensor according to one embodiment of the present invention.

FIG. 6 shows one embodiment according to the present invention where the preamplifier portion 2 is provided with a connector 7c for connecting the multi core cable 6a thereto.

Figure 3:
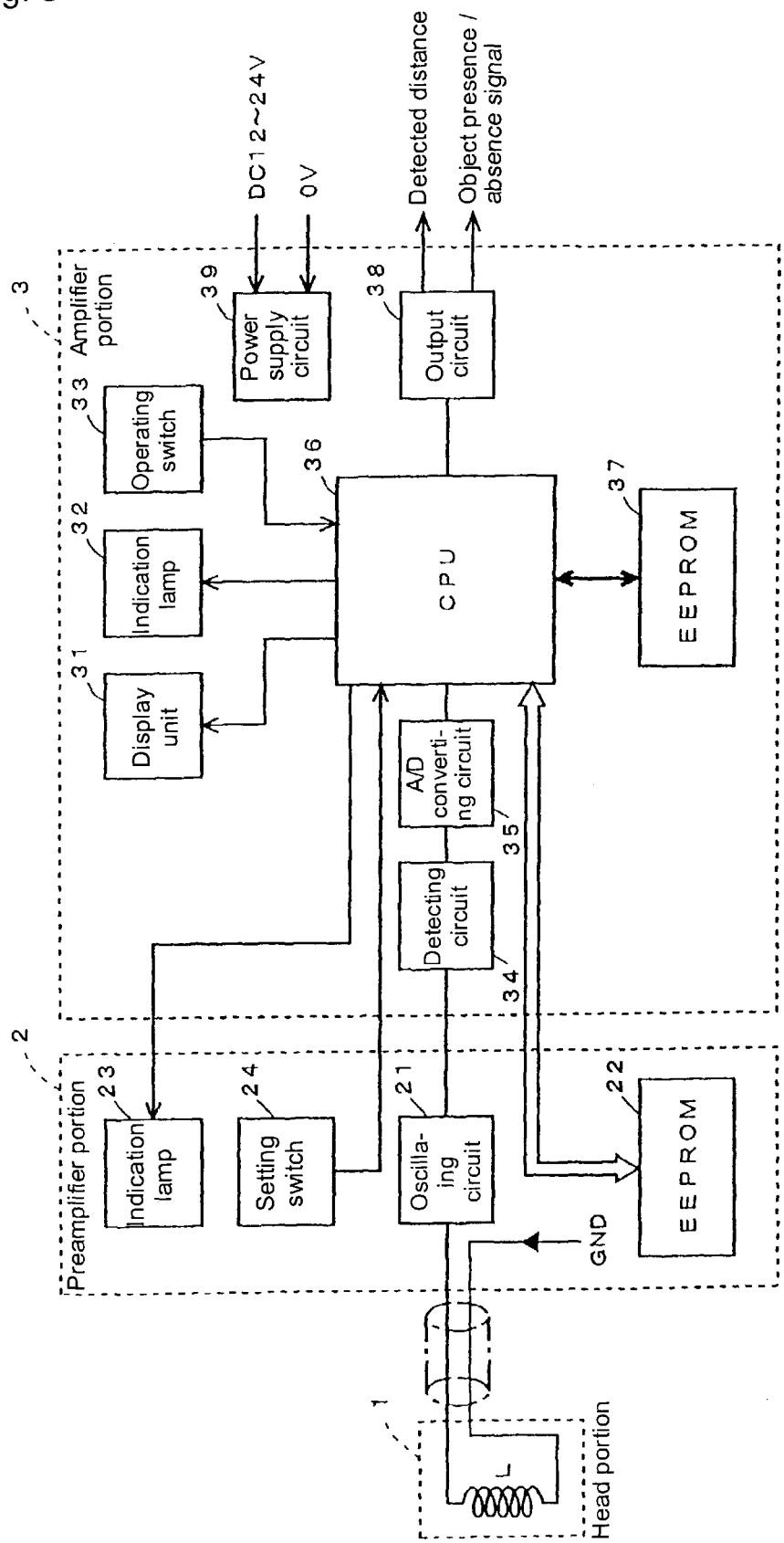
FIG. 3 is a block diagram showing an electrical structure of a proximity sensor.
Figure 4:
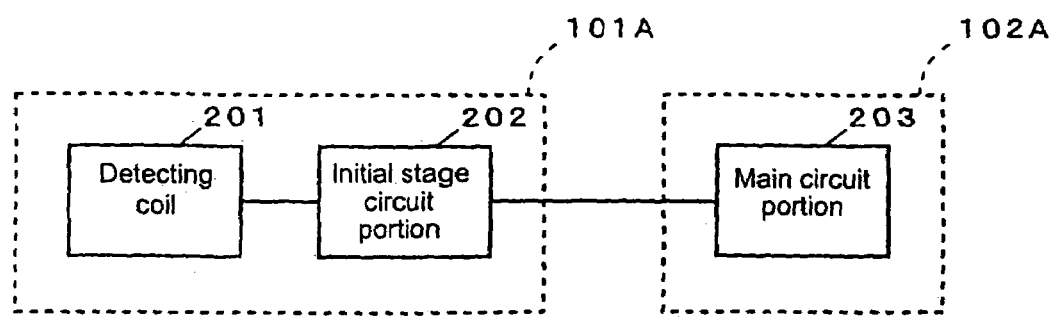
FIG. 4 is a block diagram showing an example of a structure of an amplifier separate type proximity sensor according to the prior art.
Figure 5:
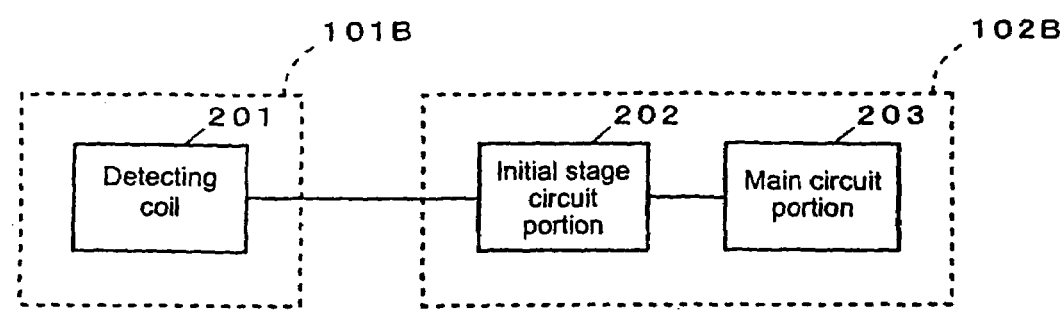
FIG. 5 is a block diagram showing another example of a structure of an amplifier separate type proximity sensor according to the prior art.

FIG. 3 shows a structural diagram of the entire circuit of the proximity sensor.

In the amplifier portion 3, a detecting circuit 34 for detecting oscillation amplitude of the oscillating circuit 21, an A/D converting circuit 35 for digitally converting output from the detecting circuit 34, a CPU 36 as a processing circuit, an EEPROM 37, an output circuit 38 and so forth are arranged. Also in this amplifier portion 3, a power supply circuit 39 is arranged. This power supply circuit 39 is for generating driving power source for respective circuits in the sensor by supply of DC electric power from the outside.

To the CPU 36, in addition to the A/D converting circuit 35 and the output circuit 38, an input/output portion including the display unit 31, the indication lamp 32, the operating switch 33 and so forth mentioned above are connected. To the EEPROM 37, programs necessary for actions of the CPU 36, threshold values for setting ON/OFF the object presence/absence signal, and the like are stored, and also data input from the operating switch 33 and the preamplifier portion 2 to the CPU 36 are stored at necessity.

In the preamplifier portion 2, in addition to the oscillating circuit 21, an EEPROM 22 is arranged. Into this EEPROM 22, a compensating table for compensating the relation between the oscillation amplitude of the oscillating circuit 21 and the detected distance into a proportional relation is stored. This compensating table is set according to invariables of the detecting coil L and the oscillating circuit 21, and plural compensating tables are also set according to kinds of detection object.

The above EEPROM 22, and the display unit 23 and the setting switch 24 arranged on the upper surface of the case body 25a are connected to the CPU 36 in the amplifier portion 3.

In the structure, when high frequency current flow to the detecting coil L by the oscillating action of the oscillating circuit 21 in the preamplifier, a detection area for a metallic material is set by a line of magnetic force induced from the detecting coil L. In this status, if a metallic material goes into the detection area, the CPU 36 at the side of the amplifier portion 3 takes in oscillation amplitude in detection status by the detecting circuit 34 and the A/D converting circuit 35, and compensate this amplitude value on the basis of the compensating table stored in the EEPROM 22 at the side of the preamplifier portion 2, and specifies a level value to output the value as a detected distance. This detected distance is output as voltage via the output circuit 38, and is also displayed digitally on the display unit 31.

And the CPU 36 compares the detected distance with a threshold value set in the EEPROM 37 at the side of the amplifier portion 3, and if the detected distance is below this threshold value, the CPU 36 sets ON the object presence/absence signal. And when this object presence/absence signal is in its ON status, the CPU 36 turns on the indication lamp 32 of the amplifier portion and the indication lamp 23 at the side of the preamplifier portion 2, thereby informs that there is an object in the detection area concerned.

By the way, as the threshold value for controlling the object presence/absence signal, a default threshold value set by manufacturers may be stored into the EEPROM 37 at the side of the amplifier portion 3. While, the CPU 36 may change the threshold value at necessity, according to the operation of the operating switch 33 at the side of the amplifier portion 3 or the setting switch 24 at the side of the preamplifier portion 2.

And in the preamplifier portion 2, the indication lamp 23 to display the ON status of the object presence/absence signal is arranged, accordingly, especially in the case where the amplifier portion 3 is installed far, it is possible to carry out installation of the head portion 1, checking the detection actions by the indication lamp 23 on the preamplifier portion 2 arranged nearby, as a result, convenience may be increased greatly. And in the case when to set a threshold value for outputting the object presence/absence signal, it is possible to carry out adjustment by the setting switch 24, checking the positional relation between the head portion 1 and an detection object and the lighting status of the indication lamp 23, as a consequence, it is possible to carry out settings according to detection purposes in easy and yet precise manners.

Further, in the proximity sensor according to the preferred embodiment, by use of the EEPROM 22 of the preamplifier portion 2, it is possible to make the CPU 36 have the following functions.

(1) At manufacturers' places, the oscillation amplitude of the oscillating circuit 21 in the status without a detection object may be stored, as a standard oscillation amplitude, into the EEPROM 22 of the preamplifier portion 2. And to the amplifier portion 3, an inspection mode to check whether the oscillation amplitude in the status without a detection object is appropriate or not is prepared. In this inspection mode, for example, the CPU 36 compares the actual oscillation amplitude with the standard oscillation amplitude stored in the EEPROM 22, and when the difference between the two exceeds a specific value, the CPU 36 displays an error code on the display unit 31 and carries out similar processing.

Thereby, because it is possible to check the decline of detection precision owing to deterioration of the detecting coil L and so forth at necessity, it is possible to judge the period to exchange the head portion 1 and the preamplifier portion 2 in easy menners.

(2) At the moment when to store the setting data into the EEPROM 37 at the amplifier portion 3, the same data may be stored also into the EEPROM 22 at the preamplifier portion 2. Thereby, in the case where the amplifier portion 3 is exchanged owing to failure or so, the CPU 36 at the new amplifier portion 3 may read out the data stored in the EEPROM 22 and set the data into the EEPROM 37 at the amplifier portion. Accordingly, when the amplifier portion 3 is exchanged, there is no need to carry out once again the same setting process that was made to the former amplifier portion 3, as a result, efficiency of exchanging work may be improved.

(3) In normal detection processing, the CPU 36 may detect action errors of the oscillating circuit 21 (an error wherein a status of oscillation amplitude closely resembling zero continues over a specific time period, and so forth). Herein, when the CPU 36 detects an error, the CPU 36 may display code information representing the contents of the error concerned and the occurrence time of the error on the display unit 32, and stores the same data as this display data into the EEPROM 22 at the preamplifier portion 2.

Thereby, in the case when the head portion 1 through the preamplifier portion 2 are removed owing to a failure and brought into a repair center, on the basis of the data stored in the EEPROM 22 at the preamplifier portion 2, it is possible to judge the cause of the fault in easy manners, and it is possible to carry out repairing work in precise and efficient manners.

In the preferred embodiment, the EEPROM 22 is arranged in the preamplifier portion 2, in order to output the distance to a detection object at high precision, and to give the added values shown in the (1) through (3), however, in the case where this proximity sensor is to function as a proximity switch that gets ON according to a detection object, a preamplifier portion 2 without the EEPROM 22 may be used. And in the case to make a nonmagnetic metallic material as a detection object, the amplifier portion 3 may be set so as to detect the presence or absence of a metallic material and the distance to a metallic material according to changes of oscillation frequency.

As mentioned heretofore, according to the present invention, wherein a preamplifier portion is arranged via cables between a head portion containing a detecting coil and an amplifier portion to output a signal representing a detection result, and an oscillating circuit whose settings have to be changed according to kinds of the detecting coil, it is possible to make the head portion compact and highly environment resistant, also to use the amplifier portion of an identical type even when the kind of the detecting coil changes, as a consequence, it is possible to reduce costs at users' side and manufacturers' side. And further, by fixing the cable length between the head portion and the preamplifier portion, while making the cable length freely changeable between the preamplifier portion and the amplifier portion, it is possible to install the amplifier portion in a desired place, without affecting upon actions of the oscillating circuit.

What is claimed is:

1. A modular proximity sensor comprising:
   a modular head portion containing a detecting coil;
   a modular preamplifier portion having an oscillating circuit and a supporting member for supporting the modular preamplifier in a fixed position;
   a modular amplifier portion having a processing circuit;
   a first cable for connecting the modular head portion and the modular preamplifier portion; and
   a second cable for connecting the modular preamplifier portion and the modular amplifier portion, wherein
   the oscillating circuit of the modular preamplifier portion is connected to the detecting coil of the modular head portion via the first cable, and oscillates the detecting coil as a resonance circuit element to affect upon oscillation continuation and suspension, oscillation amplitude, or oscillation frequency,
   the modular preamplifier portion outputs oscillation output of the oscillating circuit, or output of detected oscillation output via the second cable to the modular amplifier portion, and
   the processing circuit of the modular amplifier portion detects the presence or absence of an object or the distance from an object, on the basis of the output taken via the second cable from the modular preamplifier portion.

2. A modular proximity sensor according to claim 1, wherein the modular preamplifier portion is equipped with a memory to which information corresponding to the combination of the detecting coil and the oscillating circuit is stored.

3. A modular proximity sensor according to claim 1, wherein the processing circuit for converting the oscillation output of the oscillating circuit into a signal representing a distance is arranged in the modular amplifier portion, and parameters necessary for the conversion processing are stored in the memory.

4. A modular proximity sensor according to claim 1, wherein information representing a standard oscillation output of the oscillating circuit is written into the memory, and the processing circuit includes error detecting means for collating the oscillation output of the oscillating circuit and the standard oscillation output in the memory and thereby detecting an action error of the oscillating circuit.

5. A modular proximity sensor according to claim 1, wherein the modular preamplifier portion includes a connector for connecting the second cable thereto.

6. A modular proximity sensor according to claim 1, wherein the second cable comprises connection cables attached to the modular preamplifier portion and the modular amplifier portion respectively, and a connectable connector arranged at the end of each of the connection cables.

7. A modular proximity sensor comprising:
a modular head portion containing a detecting coil;
a modular preamplifier portion having an oscillating circuit and a readable and writeable nonvolatile memory to which information corresponding to the combination of the detecting coil and the oscillating circuit is stored;
a modular amplifier portion having a processing circuit for converting the oscillation output of the oscillating circuit into a signal representing a distance, parameters necessary for conversion processing being stored in the memory, the processing circuit being set so as to be able to write specific information into the memory;
a first cable for connecting the modular head portion and the modular preamplifier portion; and
a second cable for connecting the modular preamplifier portion and the modular amplifier portion,
wherein the oscillating circuit of the modular preamplifier portion is connected to the detecting coil of the modular head portion via the first cable, and oscillates the detecting coil as a resonance circuit element to affect oscillation continuation and suspension, oscillation amplitude or oscillation frequency, and
wherein the modular preamplifier portion outputs oscillation output to the oscillating circuit, or output of detected oscillation output via the second cable to the modular amplifier portion, and the processing circuit of the modular amplifier portion detects the presence or absence of an object or the distance from an object, on the basis of the output taken via the second cable from the modular preamplifier portion.

8. A modular proximity sensor comprising:
a modular head portion containing a detecting coil;
a modular preamplifier portion having an oscillating circuit and an indication lamp;
a modular amplifier portion having a processing circuit;
a first cable for connecting the modular head portion and the modular preamplifier portion; and
a second cable for connecting the modular preamplifier portion and the modular amplifier portion, wherein
the oscillating circuit of the modular preamplifier portion is connected to the detecting coil of the modular head portion via the first cable, and oscillates the detecting coil as a resonance circuit element to affect upon oscillation continuation and suspension, oscillation amplitude, or oscillation frequency,
the modular preamplifier portion outputs oscillation output of the oscillating circuit, or output of detected oscillation output via the second cable to the modular amplifier portion, and
the processing circuit of the modular amplifier portion detects the presence or absence of an object or the distance from an object, on the basis of the output taken via the second cable from the modular preamplifier portion and the indication lamp is lit when an amplifier signal indicating the presence or absence of an object is activated.

9. A modular proximity sensor according to claim 8, wherein the modular preamplifier portion is equipped with a memory to which information corresponding to the combination of the detecting coil and the oscillating circuit is stored.

10. A modular proximity sensor according to claim 8, wherein the processing circuit for converting the oscillation output of the oscillating circuit into a signal representing a distance is arranged in the modular amplifier portion, and parameters necessary for the conversion processing are stored in the memory.

11. A modular proximity sensor according to claim 8, wherein information representing a standard oscillation output of the oscillating circuit is written into the memory, and the processing circuit includes error detecting means for collating the oscillation output of the oscillating circuit and the standard oscillation output in the memory and thereby detecting an action error of the oscillating circuit.

12. A modular proximity sensor according to claim 8, wherein the modular preamplifier portion includes a connector for connecting the second cable thereto.

13. A modular proximity sensor according to claim 8, wherein the second cable comprises connection cables attached to the preamplifier portion and the amplifier portion respectively, and a connectable connector arranged at the end of each of the connection cables.

14. A modular proximity sensor comprising:
a modular head portion containing a detecting coil;
a modular preamplifier portion having an oscillating circuit and a volume switch;
a modular amplifier portion having a processing circuit;
a first cable for connecting the modular head portion and the modular preamplifier portion; and
a second cable for connecting the modular preamplifier portion and the modular amplifier portion, wherein
the oscillating circuit of the modular preamplifier portion is connected to the detecting coil of the modular head portion via the first cable, and oscillates the detecting coil as a resonance circuit element to affect upon oscillation continuation and suspension, oscillation amplitude, or oscillation frequency,
the modular preamplifier portion outputs oscillation output of the oscillating circuit, or output of detected oscillation output via the second cable to the modular amplifier portion, and
the processing circuit of the modular amplifier portion detects the presence or absence of an object or the distance from an object, on the basis of the output taken via the second cable from the modular preamplifier portion and the volume switch sets a threshold value to control the on and off status of an amplifier signal indicating the presence or absence of an object.

15. A modular proximity sensor according to claim 14, wherein the modular preamplifier portion is equipped with a memory to which information corresponding to the combination of the detecting coil and the oscillating circuit is stored.

16. A modular proximity sensor according to claim 14, wherein the processing circuit for converting the oscillation output of the oscillating circuit into a signal representing a distance is arranged in the modular amplifier portion, and parameters necessary for the conversion processing are stored in the memory.

17. A modular proximity sensor according to claim 14, wherein information representing a standard oscillation output of the oscillating circuit is written into the memory, and the processing circuit includes error detecting means for collating the oscillation output of the oscillating circuit and the standard oscillation output in the memory and thereby detecting an action error of the oscillating circuit.

18. A modular proximity sensor according to claim 14, wherein the modular preamplifier portion includes a connector for connecting the second cable thereto.

19. A modular proximity sensor according to claim 14, wherein the second cable comprises connection cables attached to the preamplifier portion and the amplifier portion respectively, and a connectable connector arranged at the end of each of the connection cables.

* * * * *